United States Patent
Kim

(10) Patent No.: US 9,064,567 B2
(45) Date of Patent: Jun. 23, 2015

(54) ELECTRONIC DEVICE INCLUDING A MEMORY AND METHOD FOR FABRICATING THE SAME

(71) Applicant: SK HYNIX INC., Icheon (KR)

(72) Inventor: Beom-Yong Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/249,251

(22) Filed: Apr. 9, 2014

(65) Prior Publication Data
US 2015/0138872 A1    May 21, 2015

(30) Foreign Application Priority Data
Nov. 15, 2013 (KR) .................. 10-2013-0138784

(51) Int. Cl.
*G11C 13/00* (2006.01)
*H01L 45/00* (2006.01)

(52) U.S. Cl.
CPC ............. *G11C 13/0007* (2013.01); *H01L 45/08* (2013.01); *G11C 13/0021* (2013.01); *G11C 2213/77* (2013.01); *G11C 2213/31* (2013.01); *H01L 45/1233* (2013.01); *H01L 45/147* (2013.01)

(58) Field of Classification Search
CPC ........ G11C 13/0007–13/0011; G11C 13/0021; G11C 2213/11–2213/13; G11C 2213/31; G11C 2213/77; H01L 45/08–45/085; H01L 45/1233; H01L 45/147
See application file for complete search history.

(56) References Cited

U.S. PATENT DOCUMENTS

| | | | |
|---|---|---|---|
| 7,767,499 B2* | 8/2010 | Herner | 438/129 |
| 7,923,305 B1* | 4/2011 | Nguyen et al. | 438/128 |
| 8,581,226 B2* | 11/2013 | Takahashi | 257/5 |
| 8,664,651 B2* | 3/2014 | Banno | 257/43 |
| 8,766,233 B2* | 7/2014 | Sakotsubo et al. | 257/4 |
| 2014/0103283 A1* | 4/2014 | Park et al. | 257/4 |

FOREIGN PATENT DOCUMENTS

| | | |
|---|---|---|
| KR | 10-2014-0038248 A | 3/2014 |
| KR | 10-2014-0046809 A | 4/2014 |

* cited by examiner

*Primary Examiner* — Harry W Byrne
*Assistant Examiner* — Lance Reidlinger

(57) ABSTRACT

An electronic device includes a semiconductor memory unit. The semiconductor memory unit includes first lines extending along a first direction; second lines extending along a second direction that intersects with the first direction; a silicon-added metal oxide layer disposed in each intersection region of the first lines and the second lines; a metal oxide layer that is disposed alternately with the silicon-added metal oxide layer in the first direction and that is disposed in a region between two adjacent second lines and over a corresponding one of the first lines over which the silicon-added metal oxide layer is disposed; and a silicon oxide layer that is disposed alternately with the silicon-added metal oxide layer in the second direction and that is disposed in a region between two first lines and under a corresponding one of the second lines under which the silicon-added metal oxide layer is disposed.

11 Claims, 9 Drawing Sheets

ELECTRONIC DEVICE INCLUDING A MEMORY AND METHOD FOR FABRICATING THE SAME

CROSS-REFERENCE TO RELATED APPLICATIONS

The present application claims priority to Korean Patent Application No. 10-2013-0138784, entitled "ELECTRONIC DEVICE AND METHOD FOR FABRICATING THE SAME" and filed on Nov. 15, 2013, which is incorporated herein by reference in its entirety.

TECHNICAL FIELD

Embodiments of the present disclosure relate to memory circuits and devices and their applications in electronic devices or systems.

BACKGROUND

As electronic appliances become smaller, semiconductor devices that have low power consumption, high performance, multi-functionality, and so on, are increasingly in demand. Semiconductor devices are devices that store information, and are utilized in various electronic appliances such as computers, portable communication devices, and so on. Such semiconductor devices store data using a characteristic switching between different resistance states according to a voltage or current applied thereto. For example, semiconductor devices include resistive random access memory (RRAM) devices, phase change random access memory (PRAM) devices, ferroelectric random access memory (FRAM) devices, magnetic random access memory (MRAM) devices, E-fuses, etc.

SUMMARY

Embodiments of the present disclosure relate to an electronic device and a fabrication method thereof, which achieve a high degree of integration with a simple fabrication process, and obtain improved data storage characteristics.

In one aspect, an electronic device including a semiconductor memory unit that includes: first lines stretched in a first direction; second lines stretched in a second direction that intersects with the first direction; a silicon-added metal oxide layer disposed between the first lines and the second lines at cross points of the first lines and the second lines; a metal oxide layer that is disposed alternately with the silicon-added metal oxide layer in the first direction between the first lines and the second lines while overlapping the first lines; and a silicon oxide layer that is disposed alternately with the silicon-added metal oxide layer in the second direction between the first lines and the second lines while overlapping the second lines.

Implementations of the above device may include one or more of the following.

The silicon-added metal oxide layer is a variable resistor that switches between different resistance states based on how oxygen vacancy inside the silicon-added metal oxide layer moves, and the metal oxide layer and the silicon oxide layer are insulators. The silicon oxide layer is thinner than the metal oxide layer. The metal oxide layer satisfies stoichiometry. The silicon-added metal oxide layer and the metal oxide layer include the same metal. The silicon-added metal oxide layer is a tantalum oxide layer to which silicon is added.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is part of the memory or the buffer memory in the memory system.

In another aspect, a method for fabricating an electronic device that includes a semiconductor memory unit includes: forming a first stacked structure stretched in a first direction over a substrate and including first lines and a first material layer containing a metal or a metal oxide stacked therein and a second stacked structure stretched in a second direction that intersects with the first direction and including second lines and a second material layer containing silicon or a silicon oxide stacked therein, where the first material layer and the second material layer contact each other at cross points of the first stacked structure and the second stacked structure; and forming a silicon-added metal oxide layer at the cross points of the first stacked structure and the second stacked structure by performing an oxidation process on the substrate including the first stacked structure and the second stacked structure.

Implementations of the above method may include one or more of the following.

The first material layer is a metal layer, and the metal layer changes into a metal oxide layer in an area except the cross points during the oxidation process. The metal oxide layer satisfies stoichiometry. The first material layer is a metal oxide layer containing a less content of oxygen than a content required in stoichiometry, and the metal oxide layer changes to satisfy the stoichiometry in an area except the cross points during the oxidation process. The second material layer is a silicon layer, and the silicon layer changes into a silicon oxide layer in an area except the cross points during the oxidation process. The second material layer is thinner than the first material layer.

In another aspect, a method for fabricating an electronic device that includes a semiconductor memory unit includes: forming a first stacked structure stretched in a first direction over a substrate and including first lines and a first material layer containing a metal or a metal oxide stacked therein and a second stacked structure stretched in a second direction that intersects with the first direction and including second lines and a second material layer containing silicon or a silicon oxide stacked therein, where the first material layer and the second material layer contact each other at cross points of the first stacked structure and the second stacked structure and at least one between the first material layer and the second material layer is an oxide-based material layer; and forming a silicon-added metal oxide layer at the cross points of the first stacked structure and the second stacked structure by performing a thermal treatment on the substrate including the first stacked structure and the second stacked structure.

Implementations of the above method may include one or more of the following.

The first material layer is a metal layer, and the metal layer changes into a metal oxide layer in an area except the cross points during the thermal treatment. The metal oxide layer satisfies stoichiometry. The second material layer is a silicon layer, and the silicon layer changes into a silicon oxide layer in an area except the cross points during the thermal treatment. The second material layer is thinner than the first material layer.

These and other aspects, implementations and associated advantages will become apparent in view of the drawings and the description of embodiments provided herein, which are intended to provide further explanation of the invention as claimed.

DETAILED DESCRIPTION

Figure 1:
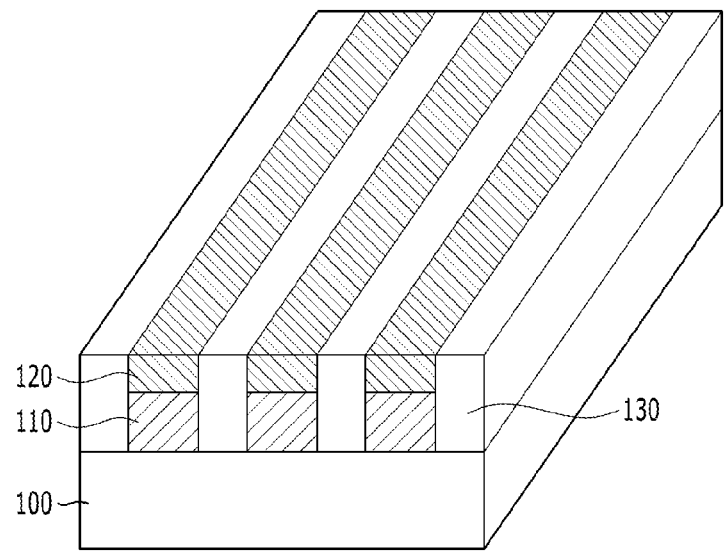
FIGS. 1 to 3 illustrate a semiconductor device in accordance with an embodiment of the present disclosure.

Embodiments of the present disclosure are described below in detail with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence in which the layers are arranged reflects a particular implementation of an embodiment and a different relative positioning relationship or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, but may also represent a structure where one or more other intermediate layers exist between the first layer and the second layer or between the first layer and the substrate.

Before the description of embodiments begins, a variable resistor including a metal oxide will be described. A variable resistor is a structure having a body whose resistance level switches between different resistance states according to a voltage or current applied thereto. The variable resistor may have a single-layer structure or a multi-layer structure including any of the diverse materials used for a resistive random access memory (RRAM) device, a phase-change RAM (PRAM) device, a ferroelectric RAM (FRAM) device, and a magnetic RAM (MRAM) device. Such materials may include metal oxides, such as a transition metal oxide and a perovskite-based material, a phase-change substance, such as a chalcogenide-based material, a ferroelectric material, and a ferromagnetic material.

When a metal oxide is used as the variable resistor, the resistance of the variable resistor may change depending on the movement of oxygen vacancies within the metal oxide. In other words, when filaments, which form a sort of current path, are generated within the variable resistor, the metal oxide has a low resistance state. On the other hand, when the filaments disappear, the metal oxide has a high resistance state. A metal oxide may be used as a variable resistor when the metal oxide contains enough oxygen vacancies to generate the filaments.

Oxygen vacancies may be formed using diverse methods. In some embodiments, the oxygen vacancies may be formed within a metal oxide by adding silicon. Since silicon has four outermost valence electrons, it may be used as an agent for reducing oxygen in the metal oxide. To be specific, when silicon is added to a metal oxide, the silicon is combined with oxygen to thereby remove the oxygen from the metal oxide, and an oxygen vacancy is formed in the space from which the oxygen is removed. In this way, the number of oxygen vacancies in the metal oxide is increased. The more silicon is added to the metal oxide, the more oxygen vacancies are formed, enhancing resistance switching characteristics.

Hereafter, a semiconductor device using a silicon-added metal oxide layer as a variable resistor, and a method for fabricating the semiconductor device will be described.

Figure 2:
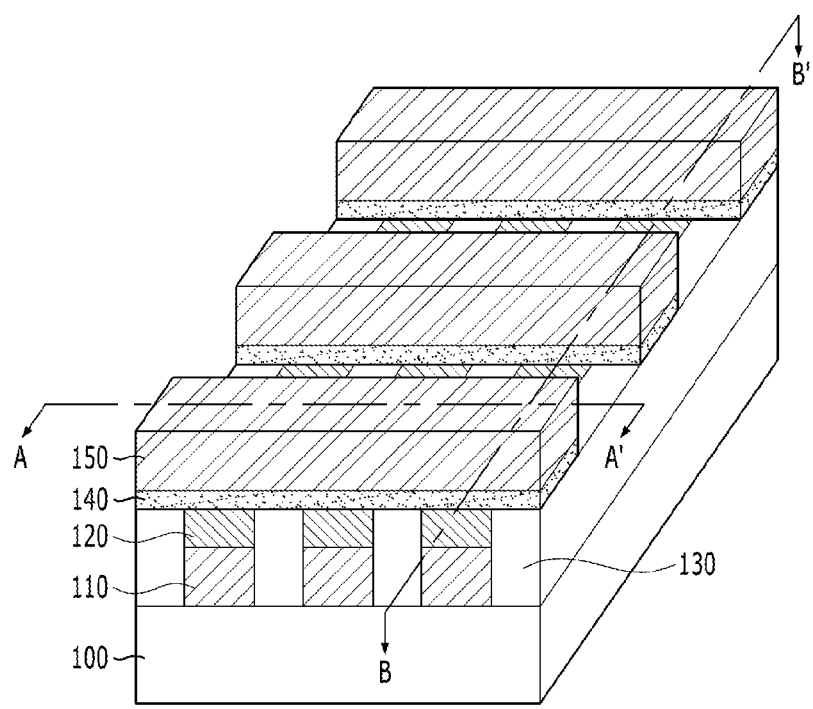
Figure 3:
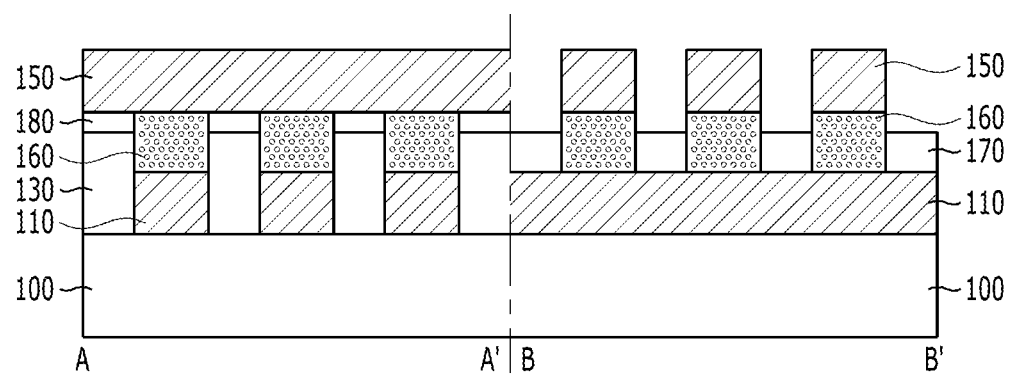

FIGS. 1 to 3 illustrate a semiconductor device in accordance with an embodiment of the present disclosure. FIGS. 1 and 2 are perspective views of the semiconductor device after a fabrication process is performed, and FIG. 3 is a cross-sectional view of the semiconductor device taken along an A-A' line and a B-B' line of FIG. 2.

Referring to FIG. 1, a first line 110 and a metal layer 120 are stacked over a substrate 100 to form a stacked structure, which is referred to as a first stacked structure hereafter. The substrate 100 may include a lower structure (not shown), e.g., transistors, formed therein and/or thereon. The first stacked structure extends along a first direction that is parallel to the substrate 100, and a plurality of the first stacked structures may be arrayed to be spaced apart from each other in a second direction that intersects with the first direction, while also being parallel to the substrate 100.

The first stacked structures may be formed by sequentially depositing a conductive material for forming the first lines 110 and a metal material for forming the metal layer 120 over the substrate 100, and selectively etching the conductive material layer and the metal material layer.

The first lines 110 may be formed of any of diverse conductive materials, which include a metal, e.g., platinum (Pt), tungsten (W), copper (Cu), or tantalum, a metal nitride, e.g., titanium nitride (TiN) or tantalum nitride (TaN), polysilicon doped with an impurity, and a combination thereof. The metal layer 120 may be formed of any of diverse metals, which include titanium (Ti), tantalum (Ta), iron (Fe), tungsten (W), hafnium (Hf), niobium (Nb), zirconium (Zr), nickel (Ni), aluminum (Al), lanthanum (La), magnesium (Mg), strontium (Sr), and a combination thereof.

The space between the first stacked structures may be filled with a first insulation layer 130. The first insulation layer 130 may be formed of any of diverse insulating materials, which include an oxide, a nitride, and a combination thereof.

Referring to FIG. 2, stacked structures including a second line 150 stacked over a silicon layer 140 are referred to as second stacked structures hereafter, and are formed over the first stacked structures and the first insulation layer 130. The second stacked structures extend along the second direction, and are arrayed in the first direction to be spaced apart from each other.

The second lines 150 may be formed of any of diverse materials, which are similar to the materials used for forming the first lines 110.

The silicon layer 140 may be formed thinner than the metal layer 120 in order to form a silicon-added metal oxide layer in which metal oxide is more prevalent than silicon oxide.

As a result of the processes illustrated in FIG. 2, the metal layer 120 may have a non-exposed portion, which is covered by the second stacked structures, and an exposed portion, which is not covered by the second stacked structures, and the silicon layer 140 may have exposed sidewalls.

Referring to FIG. 3, an oxidation process may be performed on the resultant structure obtained from the processes illustrated in FIG. 2.

During the oxidation process, the exposed portion of the metal layer 120 may be oxidized to become a metal oxide layer 170. Herein, when the metal layer 120 reacts with oxygen sufficiently, oxygen vacancies within the metal oxide layer 170 may be decreased significantly. The metal oxide layer 170 is formed to satisfy a stoichiometric ratio, and may include a tantalum oxide ($Ta_2O_5$) layer or a titanium oxide ($TiO_2$) layer. In this case, it is difficult to form a conductive path in the metal oxide layer 170, and thus the metal oxide layer 170 may have insulating characteristics.

During the oxidation process, the silicon layer 140 may be oxidized as well. Specifically, a portion of the silicon layer 140 that does not contact the metal layer 120 may be oxidized to become a silicon oxide layer 180, which is an insulator. However, a portion of the silicon layer 140 that contacts the metal layer 120 may be oxidized and simultaneously react with the metal included in the metal layer 120. As a result, in intersection regions, where the silicon layer 140 and the metal layer 120 intersect, the silicon layer 140 and the metal layer 120 may be changed into a material in which silicon, metal, and/or oxygen are combined. The combined layer is referred to as a silicon-added metal oxide layer 160, hereafter. The silicon-added metal oxide layer 160 may include a bond between metal and silicon, a bond between metal and oxygen, a bond between silicon and oxygen, and/or a bond between metal, silicon and oxygen (metal-silicon-oxygen). As described above, since the silicon-added metal oxide layer 160 may contain a great deal of oxygen vacancies, it may have variable resistance characteristics.

Subsequently, although not illustrated in the drawings, a second insulation layer filling the space between the second stacked structures may be formed.

As a result of the processes described above, the semiconductor device illustrated in FIG. 3 may be fabricated.

Referring to FIG. 3, the semiconductor device includes at least the first lines 110, the second lines 150, and the silicon-added metal oxide layer 160. The first lines 110 extend along the first direction. The second lines 150 are disposed over the first lines 110 and extend along the second direction crossing the first direction. The silicon-added metal oxide layer 160 is disposed at each cross point (or intersection region) of the first lines 110 and the second lines 150, and has an island shape between the first lines 110 and the second lines 150.

The silicon-added metal oxide layer 160 may switch between different resistance states according to a voltage applied thereto through the first lines 110 and the second lines 150, which contact lower and upper surfaces of the silicon-added metal oxide layer 160, respectively. The silicon-added metal oxide layer 160 may switch between different resistance states because filaments, which form a current path, are generated or disappear depending on the movement of the oxygen vacancies in the silicon-added metal oxide layer 160. Therefore, a memory cell that stores different data depending on a resistance state may be formed at each of the cross points of the first lines 110 and the second lines 150.

As an amount of silicon in the silicon-added metal oxide layer 160 increases, the number of oxygen vacancies also increases. As a result, a memory cell may easily switch between a low resistance state and a high resistance state. This may decrease an operation current and an operation voltage. Also, an on/off ratio, which is a ratio of a current value at the low resistance state of the silicon-added metal oxide layer 160 to a current value at the high resistance state of the silicon-added metal oxide layer 160, may be increased.

In an embodiment, the number of the oxygen vacancies in the silicon-added metal oxide layer 160 may be controlled by controlling the thickness of the silicon layer 140 which is deposited in the process of FIG. 2. The thicker the silicon layer 140 is, the more the oxygen vacancies are. However, in an embodiment, the silicon layer 140 may be thinner than the metal layer 120, as described above, because the metal oxide is a dominant component in the silicon-added metal oxide layer 160.

Meanwhile, the semiconductor device further includes the metal oxide layer 170 and the silicon oxide layer 180. The metal oxide layer 170 is arrayed alternately with the silicon-added metal oxide layer 160 along the first direction over the first lines 110. That is, in an embodiment, the metal oxide layer 170 and the silicon-added metal oxide layer 160 are provided in a pattern in which the metal oxide layer 170 alternates with the silicon-added metal oxide layer 160 in the first direction. The silicon oxide layer 180 is arrayed alternately with the silicon-added metal oxide layer 160 along the second direction under the second lines 150. Since both of the metal oxide layer 170 and the silicon oxide layer 180 are insulators, the silicon-added metal oxide layers 160 may be isolated from each other by the metal oxide layer 170 and the second insulation layer (not shown) filling the space between the second stacked structures in the first direction, and isolated from each other by the silicon oxide layer 180 and the first insulation layer 130 between the first stacked structures in the second direction. In an embodiment, when the silicon layer 140 is thinner than the metal layer 120, the silicon oxide layer 180 is thinner than the metal oxide layer 170.

The semiconductor device and the method for fabricating the same, which are described above, realize a cross-point structure in which the semiconductor device is highly integrated by forming a memory cell at a cross point of an upper line and a lower line disposed over and under a resistance variable element, e.g., the silicon-added metal oxide layer 160 in FIG. 3, respectively.

In accordance with embodiments of the present disclosure, since a material layer that is comprised of variable resistors is patterned at the same time that upper or lower lines are patterned, the number of mask processes may be decreased compared to a typical fabrication method where variable resistors are patterned independently from upper and lower lines to form island shapes. Also, since the patterning of a line shape is performed to form the variable resistors, process difficulty in a mask process and an etch process may be reduced.

Also, although the material layer that is comprised of the variable resistors is patterned in the line shape, island-shaped variable resistors may be formed at cross points of upper lines and lower lines through a subsequent process by insulators such as the metal oxide layer 170 and the silicon oxide layer 180 that are disposed between the island-shaped variable resistors to isolate the variable resistors from each other. Therefore, a disturbance between memory cells may be prevented.

Furthermore, a semiconductor device and a method for fabricating the same in accordance with an embodiment, which are described above, may easily obtain a silicon-added metal oxide layer 160 having excellent switching characteristics to be used as a variable resistor. The characteristics of a silicon-added metal oxide layer 160 in accordance with an embodiment will be described later with reference to FIGS. 5 and 6.

Although the above embodiment describes first lines 110 disposed under a metal layer 120 and second lines 150 disposed over a silicon layer 140, embodiments are not limited thereto. Positions of the metal layer 120 and the silicon layer 140 may be switched. In another embodiment, the silicon layer 140 is formed to extend along the first direction together with the first lines 110, and the metal layer 120 is formed to extend along the second direction together with the second lines 150. In this embodiment, the distribution of oxygen vacancies may be changed, but the silicon-added metal oxide layer 160 may be still formed at the cross points of the first lines 110 and the second lines 150, as in the above-described embodiment. The distribution of the oxygen vacancies will be described with reference to FIGS. 4A and 4B.

Figure 4A:
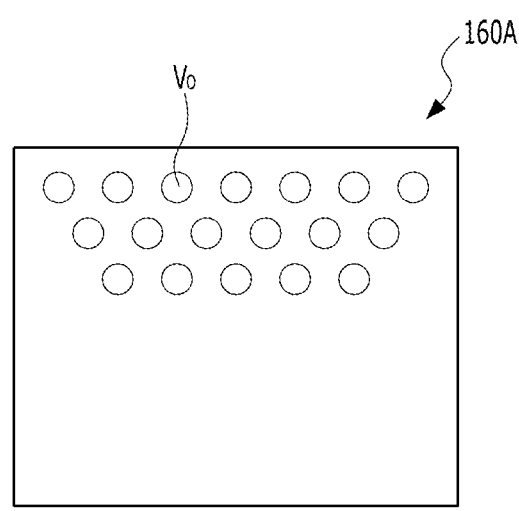
FIG. 4A illustrates oxygen vacancy distribution of a silicon-added metal oxide layer in accordance with an embodiment of the present disclosure.
Figure 4B:
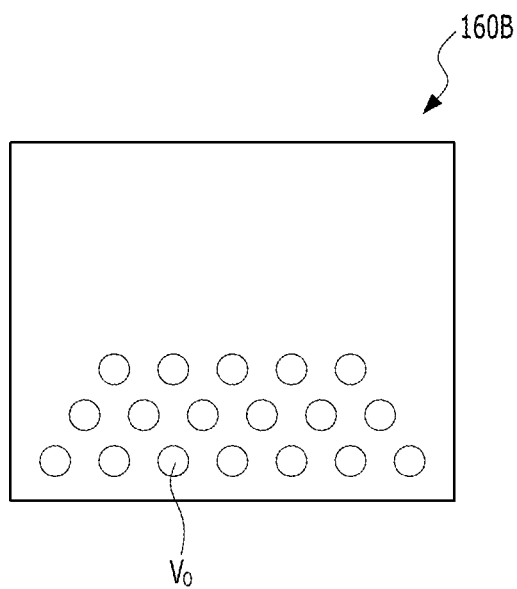
FIG. 4B illustrates oxygen vacancy distribution of a silicon-added metal oxide layer in accordance with another embodiment of the present disclosure.

FIG. 4A illustrates the oxygen vacancy distribution of a silicon-added metal oxide layer in accordance with an embodiment of the present disclosure. FIG. 4B illustrates oxygen vacancy distribution of a silicon-added metal oxide layer in accordance with another embodiment of the present disclosure.

Referring to FIG. 4A, when the metal layer 120 is disposed under the silicon layer 140, most oxygen vacancies Vo are distributed in an upper portion of a silicon-added metal oxide layer 160A, which is formed by sequentially stacking the metal layer 120 and the silicon layer 140, and the number of the oxygen vacancies Vo decreases toward a lower portion of the silicon-added metal oxide layer 160A.

Conversely, referring to FIG. 4B, when the metal layer 120 is disposed over the silicon layer 140, most oxygen vacancies Vo are distributed in a lower portion of the silicon-added metal oxide layer 160B, which is formed by sequentially stacking the silicon layer 140 and the metal layer 120, and the number of the oxygen vacancies Vo decreases toward an upper portion of the silicon-added metal oxide layer 160B.

Although the metal layer 120 and the silicon layer 140 are used to form the silicon-added metal oxide layer 160 in the above-described embodiments of the present disclosure, embodiments are not limited thereto.

In another embodiment, a metal oxide layer is used instead of a metal layer 120 so that the metal oxide layer and the silicon layer 140 react with each other to thereby form the silicon-added metal oxide layer 160 at the cross points of the first lines 110 and the second lines 150. If the metal oxide layer is short of oxygen vacancies and thus formed of a material having insulating characteristics, the oxidation process described with reference to FIG. 3 does not need to be performed. Since the metal oxide layer already includes oxygen therein, a thermal treatment to produce the reaction between the metal oxide layer and the silicon layer 140 may be performed without performing the oxidation process. However, if the metal oxide layer includes an insufficient amount of oxygen, i.e., there is not enough oxygen for the metal oxide layer to be used as an insulator, then an oxidation process may be necessary. That is, if the metal oxide layer is formed of a metal oxide containing less oxygen than that satisfying a stoichiometric ratio, the oxidation process of FIG. 3 may be required. The oxidation process is performed to increase oxygen contained in the metal oxide layer disposed between the silicon-added metal oxide layers 160 to change the metal oxide layer into an insulator.

In still another embodiment, a silicon oxide layer may be used instead of the silicon layer 140. In this embodiment, the oxidation process of FIG. 3 does not need to be performed, and a thermal treatment to produce the reaction between the metal layer 120 and the silicon oxide layer may be performed instead.

Also, in still another embodiment, a metal oxide layer is used instead of the metal layer 120 and, at the same time, a silicon oxide layer is used instead of the silicon layer 140.

As described above, even if a metal oxide layer is used instead of the metal layer 120 and/or a silicon oxide layer is used instead of the silicon layer 140, it would be apparent to a person skilled in the art that positions of the metal oxide layer and the silicon oxide layer may be switched. That is, the metal oxide layer may be disposed over or under the silicon oxide layer.

Figure 5:
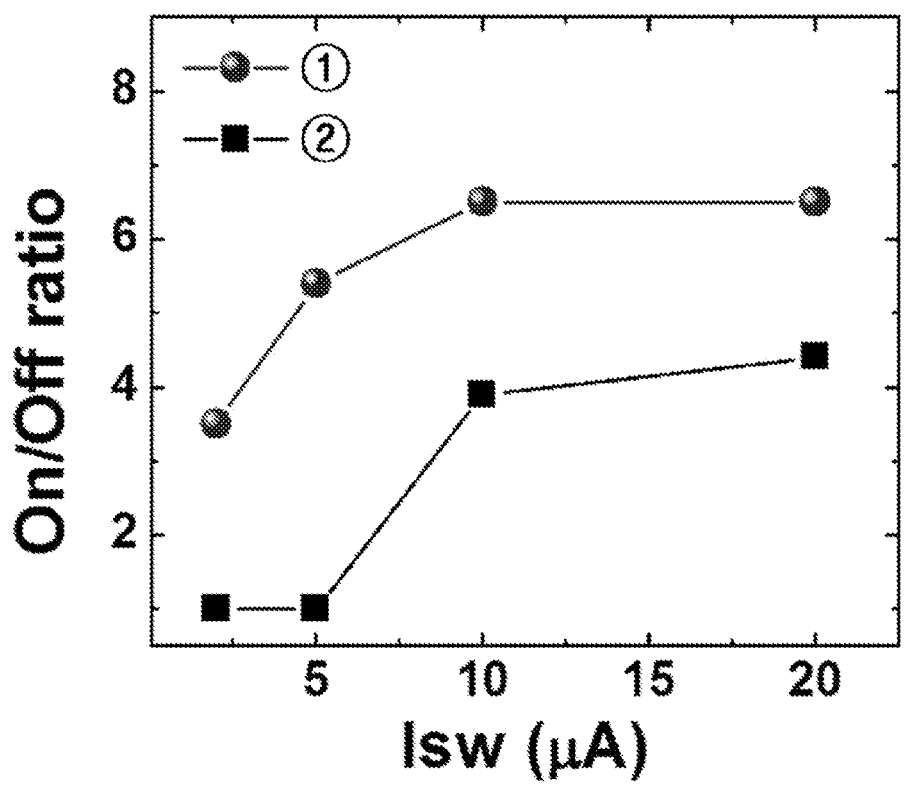
FIG. 5 is a graph showing an on/off ratio of a typical metal oxide layer and a silicon-added metal oxide layer in accordance with an embodiment of the present disclosure.
Figure 6:
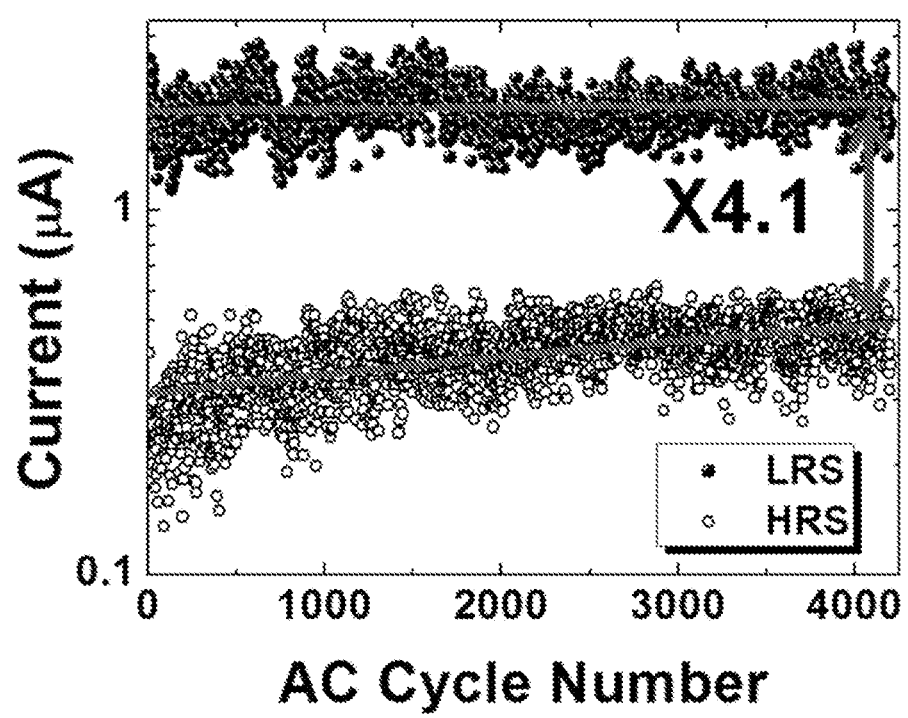
FIG. 6 is a graph showing endurance of a silicon-added metal oxide layer in accordance with an embodiment of the present disclosure.

FIGS. 5 and 6 show characteristics of a silicon-added metal oxide layer. FIG. 5 is a graph showing an on/off ratio of a metal oxide layer of a comparative example and that of a silicon-added metal oxide layer in accordance with an embodiment of the present disclosure.

FIG. 6 is a graph showing endurance of a silicon-added metal oxide layer in accordance with an embodiment of the present disclosure compared to endurance of a layer in accordance with a comparative example. The comparative example shows endurance of a tantalum oxide ($Ta_2O_5$) layer treated with hydrogen plasma to form oxygen vacancies, and the embodiment of the present disclosure shows a tantalum oxide ($Ta_2O_5$) layer to which silicon is added.

Referring to FIG. 5, it is noted that the on/off ratio of an embodiment of the present disclosure (①) is greater than the on/off ratio of the comparative example (②). Thus, the graph of FIG. 5 reveals that the switching characteristics of the embodiment of the present disclosure (①) are superior to those of the comparative example (②).

Referring to FIG. 6, AC endurance characteristics of the tantalum oxide ($Ta_2O_5$) layer with silicon added thereto is evaluated. The graph of FIG. 6 shows that the number of AC cycles is more than approximately 4000. On the other hand, the number of AC cycles of the tantalum oxide ($Ta_2O_5$) layer treated with the hydrogen plasma is measured to be approximately 100. This shows that an embodiment of the present disclosure provides excellent endurance.

Consequently, when a silicon-added metal oxide layer is used as a variable resistor in accordance with an embodiment of the present disclosure, the semiconductor device may have improved reliability.

According to embodiments of the present disclosure, an electronic device and a fabrication method thereof may achieve a high degree of integration, simplify fabrication processes, and improve data storage characteristics.

The above and other memory circuits or semiconductor devices based on the present disclosure can be used in a range of devices or systems. FIGS. 7-11 provide some examples of devices or systems that include a memory circuits in accordance with an embodiment.

Figure 7:
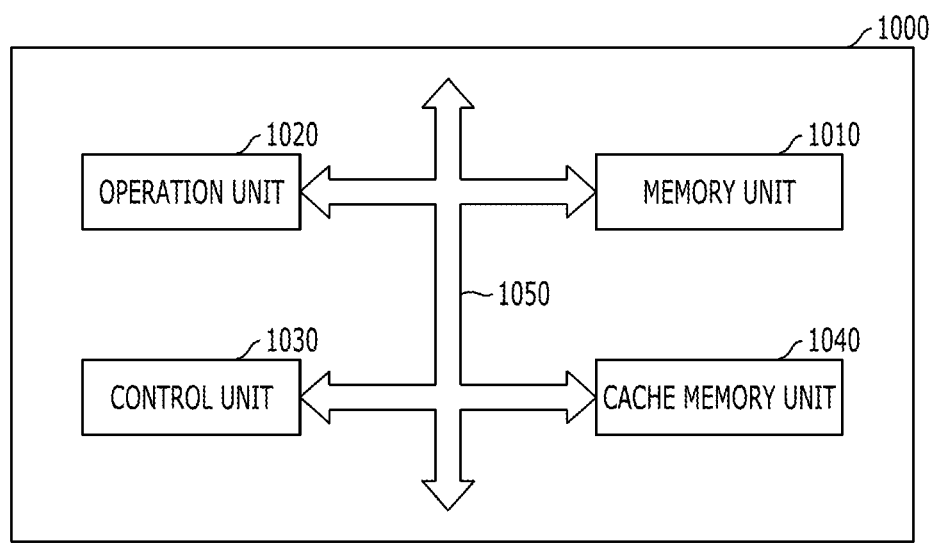
FIG. 7 is a diagram illustrating a configuration of a microprocessor implementing memory circuitry in accordance with an embodiment of the present disclosure.

FIG. 7 is a diagram illustrating a configuration of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include first lines extending along a first direction; second lines extending along a second direction that intersects with the first direction; a silicon-added metal oxide layer disposed in each intersection region of the first lines and the second lines; a metal oxide layer that is disposed alternately with the silicon-added metal oxide layer in the first direction and that is disposed in a region between two adjacent second lines and over a corresponding one of the first lines over which the silicon-added metal oxide layer is disposed; and a silicon oxide layer that is disposed alternately with the silicon-added metal oxide layer in the second direction and that is disposed in a region between two first lines and under a corresponding one of the second lines under which the silicon-added metal oxide layer is disposed. Through this, integration degree of the memory unit 1010 may be increased, and data storage characteristics of the memory unit 1010 may be improved. As a consequence, operating characteristics of the microprocessor 1000 may be improved, and a size of the microprocessor 1000 may be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
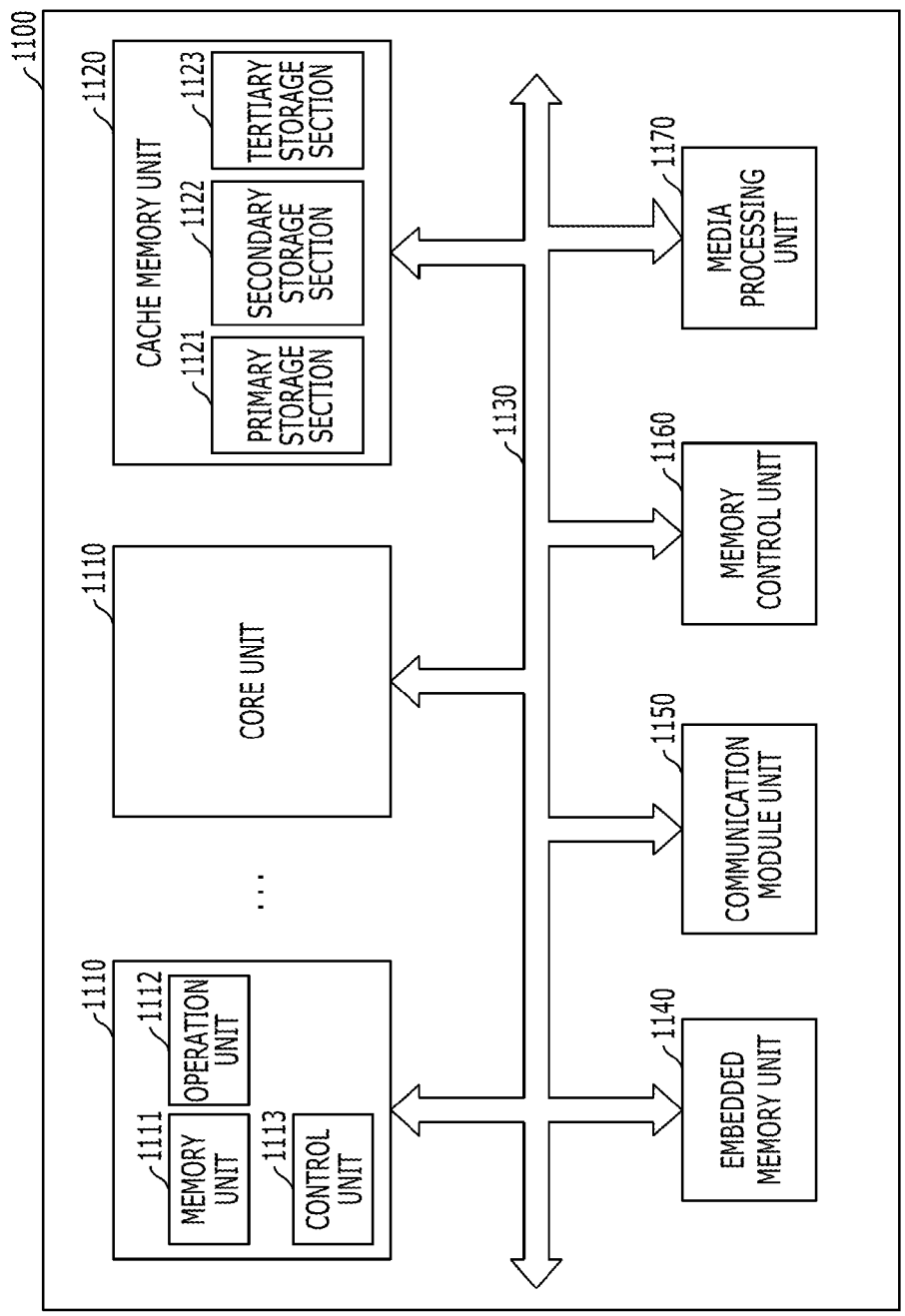
FIG. 8 is a diagram illustrating a configuration of a processor implementing memory circuitry in accordance with an embodiment of the present disclosure.

FIG. 8 is a diagram illustrating a configuration of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include first lines extending along a first direction; second lines extending along a second direction that intersects with the first direction; a silicon-added metal oxide layer disposed in each intersection region of the first lines and the second lines; a metal oxide layer that is disposed alternately with the silicon-added metal oxide layer in the first direction and that is disposed in a region between two adjacent second lines and over a corresponding one of the first lines over which the silicon-added metal oxide layer is disposed; and a silicon oxide layer that is disposed alternately with the silicon-added metal oxide layer in the second direction and that is disposed in a region between two first lines and under a corresponding one of the second lines under which the silicon-added metal oxide layer is disposed. Through this, integration degree of the cache memory unit 1120 may be increased, and data storage characteristics of the cache memory unit 1120 may be improved. As a consequence, operating characteristics of the processor 1100 may be improved, and a size of the processor 1100 may be reduced.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
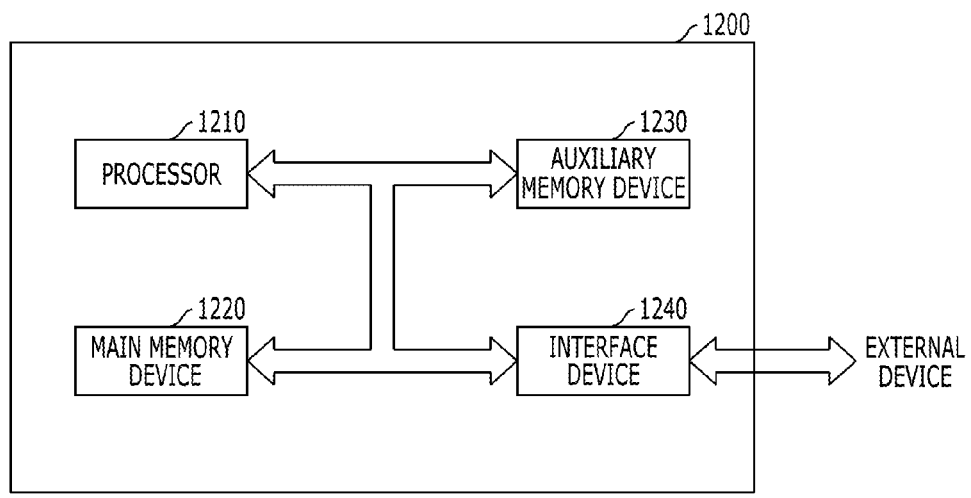
FIG. 9 is a diagram illustrating a configuration of a system implementing memory circuitry in accordance with an embodiment of the present disclosure.

FIG. 9 is a diagram illustrating a configuration of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include first lines extending along a first direction; second lines extending along a second direction that intersects with the first direction; a silicon-added metal oxide layer disposed in each intersection region of the first lines and the second lines; a metal oxide layer that is disposed alternately with the silicon-added metal oxide layer in the first direction and that is disposed in a region between two adjacent second lines and over a corresponding one of the first lines over which the silicon-added metal oxide layer is disposed; and a silicon oxide layer that is disposed alternately with the silicon-added metal oxide layer in the second direction and that is disposed in a region between two first lines and under a corresponding one of the second lines under which the silicon-added metal oxide layer is disposed. Through this, integration degree of the main memory device 1220 may be increased, and data storage characteristics of the main memory device 1220 may be improved. As a consequence, operating characteristics of the system 1200 may be improved, and a size of the system 1200 may be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include first lines extending along a first direction; second lines extending along a second direction that intersects with the first direction; a silicon-added metal oxide layer disposed in each intersection region of the first lines and the second lines; a metal oxide layer that is disposed alternately with the silicon-added metal oxide layer in the first direction and that is disposed in a region between two adjacent second lines and over a corresponding one of the first lines over which the silicon-added metal oxide layer is disposed; and a silicon oxide layer that is disposed alternately with the silicon-added metal oxide layer in the second direction and that is disposed in a region between two first lines and under a corresponding one of the second lines under which the silicon-added metal oxide layer is disposed. Through this, integration degree of the auxiliary memory device 1230 may be increased, and data storage characteristics of the auxiliary memory device 1230 may be improved. As a consequence, operating characteristics of the system 1200 may be improved, and a size of the system 1200 may be reduced.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
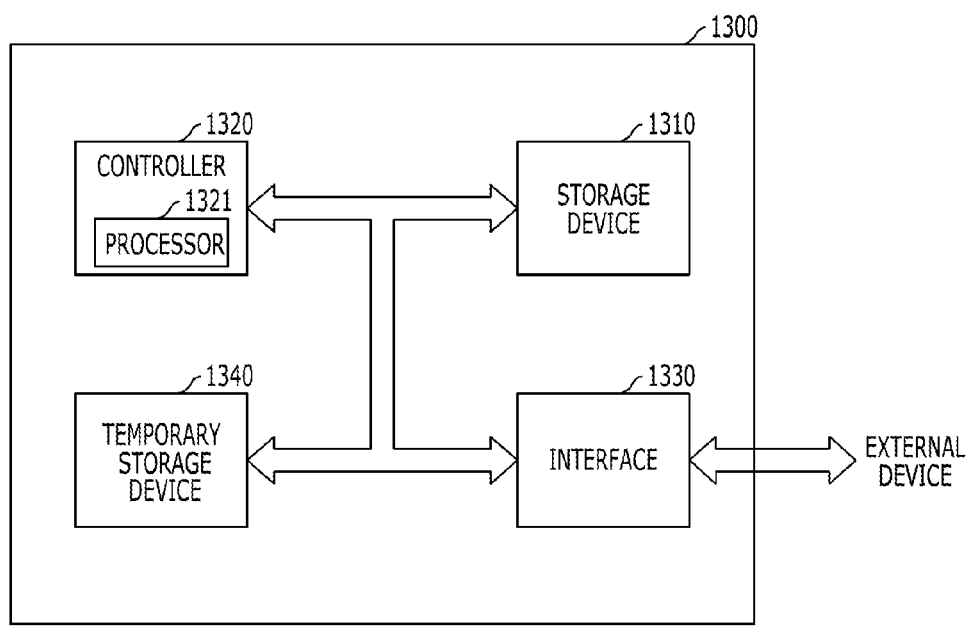
FIG. 10 is a diagram illustrating a configuration of a data storage system implementing memory circuitry in accordance with an embodiment of the present disclosure.

FIG. 10 is a diagram illustrating a configuration of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include first lines extending along a first direction; second lines extending along a second direction that intersects with the first direction; a silicon-added metal oxide layer disposed in each intersection region of the first lines and the second lines; a metal oxide layer that is disposed alternately with the silicon-added metal oxide layer in the first direction and that is disposed in a region between two adjacent second lines and over a corresponding one of the first lines over which the silicon-added metal oxide layer is disposed; and a silicon oxide layer that is disposed alternately with the silicon-added metal oxide layer in the second direction and that is disposed in a region between two first lines and under a corresponding one of the second lines under which the silicon-added metal oxide layer is disposed. Through this, integration degree of the temporary storage device 1340 may be increased, and data storage characteristics of the temporary storage device 1340 may be improved. As a consequence, operating characteristics of the data storage system 1300 may be improved, and a size of the data storage system 1300 may be reduced.

Figure 11:
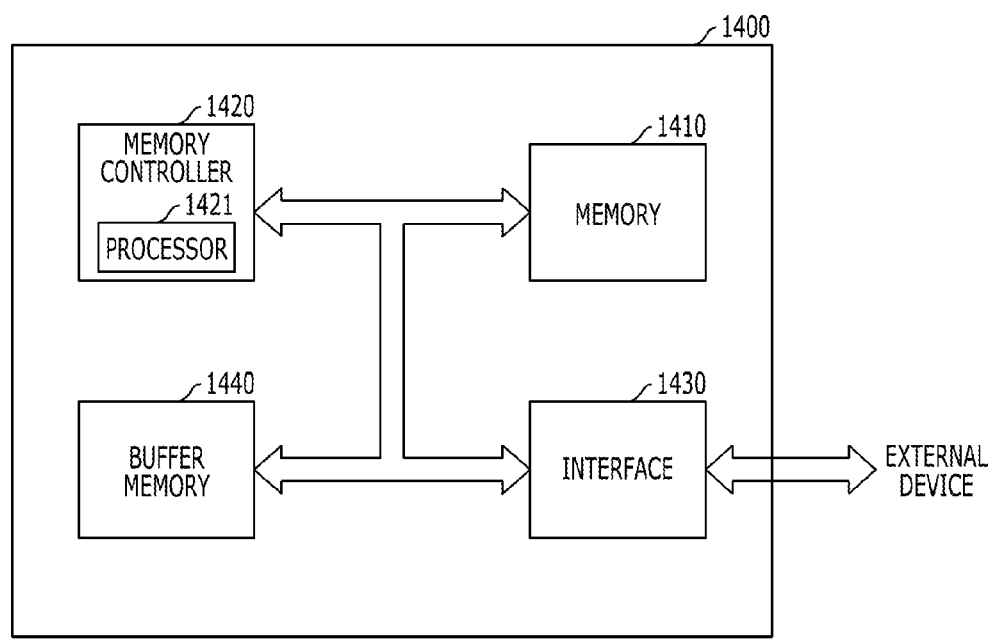
FIG. 11 is a diagram illustrating a configuration of a memory system implementing memory circuitry in accordance with an embodiment of the present disclosure.

FIG. 11 is a diagram illustrating a configuration of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include first lines extending along a first direction; second lines extending along a second direction that intersects with the first direction; a silicon-added metal oxide layer disposed in each intersection region of the first lines and the second lines; a metal oxide layer that is disposed alternately with the silicon-added metal oxide layer in the first direction and that is disposed in a region between two adjacent second lines and over a corresponding one of the first lines over which the silicon-added metal oxide layer is disposed; and a silicon oxide layer that is disposed alternately with the silicon-added metal oxide layer in the second direction and that is disposed in a region between two first lines and under a corresponding one of the second lines under which the silicon-added metal oxide layer is disposed. Through this, integration degree of the memory 1410 may be increased, and data storage characteristics of the memory 1410 may be improved. As a consequence, operating characteristics of the memory system 1400 may be improved, and a size of the memory system 1400 may be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include first lines extending along a first direction; second lines extending along a second direction that intersects with the first direction; a silicon-added metal oxide layer disposed in each intersection region of the first lines and the second lines; a metal oxide layer that is disposed alternately with the silicon-added metal oxide layer in the first direction and that is disposed in a region between two adjacent second lines and over a corresponding one of the first lines over which the silicon-added metal oxide layer is disposed; and a silicon oxide layer that is disposed alternately with the silicon-added metal oxide layer in the second direction and that is disposed in a region between two first lines and under a corresponding one of the second lines under which the silicon-added metal oxide layer is disposed. Through this, integration degree of the buffer memory 1440 may be increased, and data storage characteristics of the buffer memory 1440 may be improved. As a consequence, operating characteristics of the memory system 1400 may be improved, and a size of the memory system 1400 may be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on a memory device in accordance with this disclosure may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While the present disclosure provides a description of embodiments, these should not be construed as limitations on the scope of any invention that may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in the present disclosure should not be understood as requiring such separation in all embodiments.

Only a few implementations and examples are described. Other implementations, enhancements and variations can be made based on what is described and illustrated in the present disclosure.

What is claimed is:

1. An electronic device comprising a semiconductor memory unit, wherein the semiconductor memory unit comprises:
    first lines extending along a first direction;
    second lines extending along a second direction that intersects with the first direction;
    a silicon-added metal oxide layer disposed in each intersection region of the first lines and the second lines;
    a metal oxide layer that is disposed alternately with the silicon-added metal oxide layer in the first direction and that is disposed in a region between two adjacent second lines and over a corresponding one of the first lines over which the silicon-added metal oxide layer is disposed; and
    a silicon oxide layer that is disposed alternately with the silicon-added metal oxide layer in the second direction and that is disposed in a region between two first lines and under a corresponding one of the second lines under which the silicon-added metal oxide layer is disposed.

2. The electronic device according to claim 1, wherein the silicon-added metal oxide layer serves as a variable resistor that switches between different resistance states based on a movement of oxygen vacancies in the silicon-added metal oxide layer, and
    wherein the metal oxide layer and the silicon oxide layer are insulators.

3. The electronic device according to claim 1, wherein the silicon oxide layer is thinner than the metal oxide layer.

4. The electronic device according to claim 1, wherein the metal oxide layer includes a material layer satisfying a stoichiometric ratio.

5. The electronic device according to claim 1, wherein the silicon-added metal oxide layer and the metal oxide layer include the same metal.

6. The electronic device according to claim 1, wherein the silicon-added metal oxide layer includes a tantalum oxide layer to which silicon is added.

7. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory unit is part of the memory unit in the microprocessor.

8. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit is part of the cache memory unit in the processor.

9. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory unit is part of the auxiliary memory device or the main memory device in the processing system.

10. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside,
    wherein the semiconductor memory unit is part of the storage device or the temporary storage device in the data storage system.

11. The electronic device according to claim 1, further comprising a memory system which includes:
    a memory configured to store data and conserve stored data regardless of power supply;
    a memory controller configured to control input and output of data to and from the memory according to a command inputted from an outside;
    a buffer memory configured to buffer data exchanged between the memory and the outside; and
    an interface configured to perform communication between at least one of the memory, the memory controller and the buffer memory and the outside,
    wherein the semiconductor memory unit is part of the memory or the buffer memory in the memory system.

* * * * *